United States Patent
Wu

[11] Patent Number: 6,060,394
[45] Date of Patent: May 9, 2000

[54] METHOD FOR FORMING SHALLOW TRENCH ISOLATION WITH GLOBAL PLANARIZATION

[75] Inventor: Shye Lin Wu, Hu-Ko Shang, Taiwan

[73] Assignee: Texas instruments-Acer Incorporated, Hsin-Chu, Taiwan

[21] Appl. No.: 08/988,034

[22] Filed: Dec. 10, 1997

[30] Foreign Application Priority Data

Jun. 24, 1997 [CN] China ................................... 86108946

[51] Int. Cl.$^7$ .................................................. H01L 21/00
[52] U.S. Cl. ........................... 438/692; 216/38; 438/719; 438/723
[58] Field of Search ..................... 438/692, 693, 438/221, 719, 723; 216/38, 88, 89; 156/345 LP

[56] References Cited

U.S. PATENT DOCUMENTS

| | | | |
|---|---|---|---|
| 4,139,442 | 2/1979 | Bondur et al. ........................... | 204/192 |
| 4,157,269 | 6/1979 | Ning et al. ............................... | 148/1.5 |
| 4,944,836 | 7/1990 | Beyer et al. ............................. | 156/645 |
| 4,965,652 | 10/1990 | Magdo et al. ............................ | 352/50 |
| 5,229,326 | 7/1993 | Dennison et al. .................. | 438/692 X |
| 5,677,229 | 10/1997 | Morita et al. ....................... | 438/692 X |
| 5,817,567 | 10/1998 | Jang et al. .......................... | 438/692 X |
| 5,851,899 | 12/1998 | Weiganol ............................. | 438/692 X |

*Primary Examiner*—William Powell

[57] ABSTRACT

This invention describes a method to form shallow trench isolation with global planarization. The process steps consist of depositing the etching-resistant masked layers stacked on silicon substrate, where the isolated area region is defined; then the isolated area region is dryly etched and is to be deposited oxidation-resistant thin films and form oxidation-resistant spacers around the side walls of the isolated region with the deposited thin films. Because the thin films and spacers are oxidation resistant, during growth of an oxide film within the isolated area, the bird's beak lateral encroachment can be prevented. This results in nearly abrupt interfaces at the sides of the isolated area. In addition, a high temperature oxidation process is employed to produce a high quality of oxide film and simultaneously recover the possible damages from dry etching. This method for forming shallow trench isolation provides a better global planarization, providing a smoother platform on which further circuit elements can be built.

11 Claims, 3 Drawing Sheets

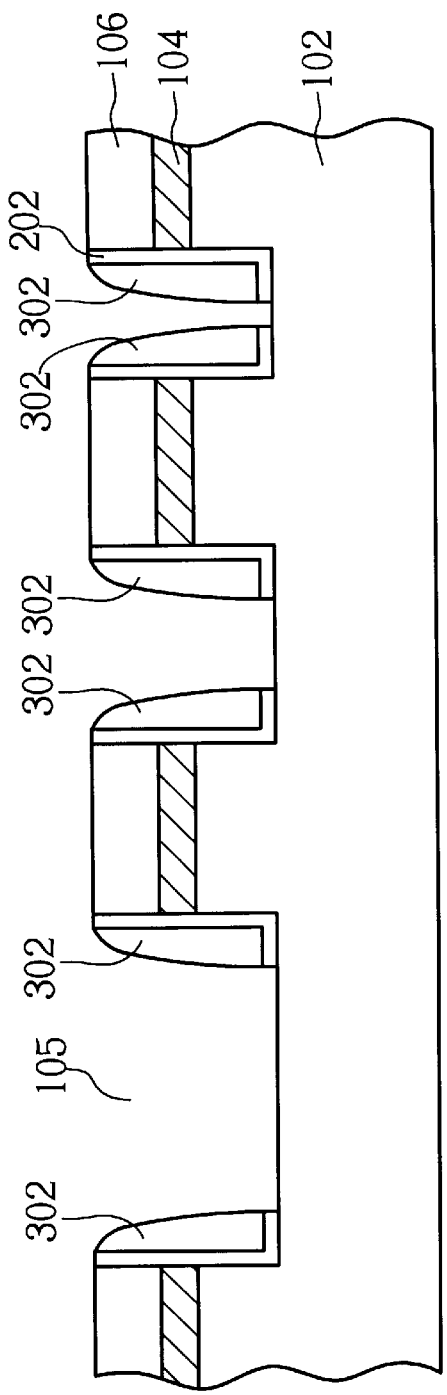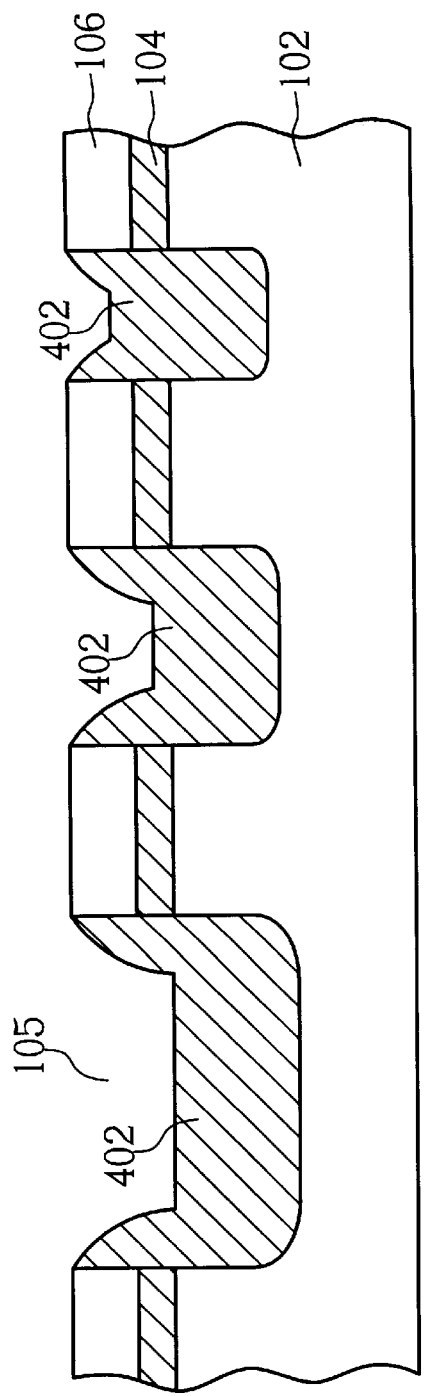

METHOD FOR FORMING SHALLOW TRENCH ISOLATION WITH GLOBAL PLANARIZATION

BACKGROUND OF THE INVENTION

1. Field of the Invention

The invention relatives to a semiconductor processing method, and more particularly to a fabrication method for forming a shallow isolation trench with global planarization on a semiconductor substrate.

2. Background of the Invention

With the advent of millions of electronic components integrated on a single chip, proper electrical isolation of the components becomes critical. It is well known that if the isolation of electrical elements is poor, boring leakage will occur, and the accumulated leakage of millions of electrical elements can result in latch up which is likely to damage the circuit and, obviously manifest itself in observable wasted power consumption. Further, such leakage affects the circuit's noise-resistance, resulting in voltage displacement and cross-talk.

In the fabrication of semiconductor ICs, there are several issues of importance such as isolation planarity, isolation depth, and abrupt transitions between active areas and isolation areas. In an IC, $SiO_2$ is typically used as the isolation layer (or isolation trench). Therefore, to produce high quality semiconductor ICs, it is crucial to effectively control the growth and characteristics of isolation layers.

Local Oxidation of Silicon (LOCOS) is a commonly employed method of forming an isolation trench. This method utilizes a mask formed by, for example, a silicon nitride film and a pad oxide to grow the $SiO_2$ isolated trench on a specific region of the chip. However, since the volume of the $SiO_2$ is as twice that of silicon, and adding the effect of lateral oxidation, a so-called bird's beak encroachment is typically formed on the two sides of the isolation trench, which will reduce the active area and shorten the channel length of the active electrical element. This results in not only deterioration of the integrated circuits but also impediments to VLSI fabrication.

In conventional approaches to the problem, such as Side Wall Masked Isolation (SWAMI), and Sealed Interface Local oxidation, etc., although avoiding some bird's beak encroachment, these processes involved are typically extremely complicated.

In other processing technology for achieving shallow trench isolation, a major step involves using plasma etching to etch the substrate to 200 nm depth and the selection of an appropriate dielectric material to fill the trench. Refer to "Characteristic of CMOS Device Isolation for the VLSI Age" in IEDN, p.671, 1994 by Bryant, et al. Although limiting the bird's beak lateral encroachment, plasma etching is apt to result in defects in the wafer and in charge leakage. In addition, this process would likely reduce the active area and shorten the channel width of the active elements.

SUMMARY OF THE INVENTION

Owing to the drawbacks in the prior art methods, one of the main objects of the present invention is to provide a simple method to decrease bird beak lateral encroachment and to fabricate a shallow trench isolation having global planarization.

The main steps of the present invention therefore consist of depositing two etching-resistant masked layers stacked on a semiconductor substrate, where the isolated area region is defined; etching the semiconductor substrate defined by the masked layers to form a recessed isolated region on the semiconductor substrate; depositing an oxidation-resistant thin film on both the surfaces of the semiconductor substrate and the isolated region; forming the oxidation-resistant spacers around the side walls of the isolated region deposited with the thin film; eliminating the thin film not masked by the spacers by using the etch back process; then, utilizing a high temperature steam oxidation process to grow an oxide film on the isolated area recessed within the substrate; depositing a dielectric material film to fill the masked layers and the oxide film; and finally removing the dielectric material film, the masked layers, and the oxide film formed between the dielectric material film and the masked layers through the process of planarization to globally planarize the shallow trench isolation.

BRIEF DESCRIPTION OF THE DRAWINGS

FIG. 3 shows the cross-sectional view of that depositing thin Poly-Si film and then etching back to form Poly-Si spacers according to the present invention.

FIG. 4 shows the cross-sectional view of that the thermal oxidation to convert the defined isolated area into silicon dioxide according to the present invention.

DESCRIPTION OF THE INVENTION

FIGS. 1 through 6 illustrate the process of the invention for fabricating shallow trench isolation with global planarization.

Figure 1:
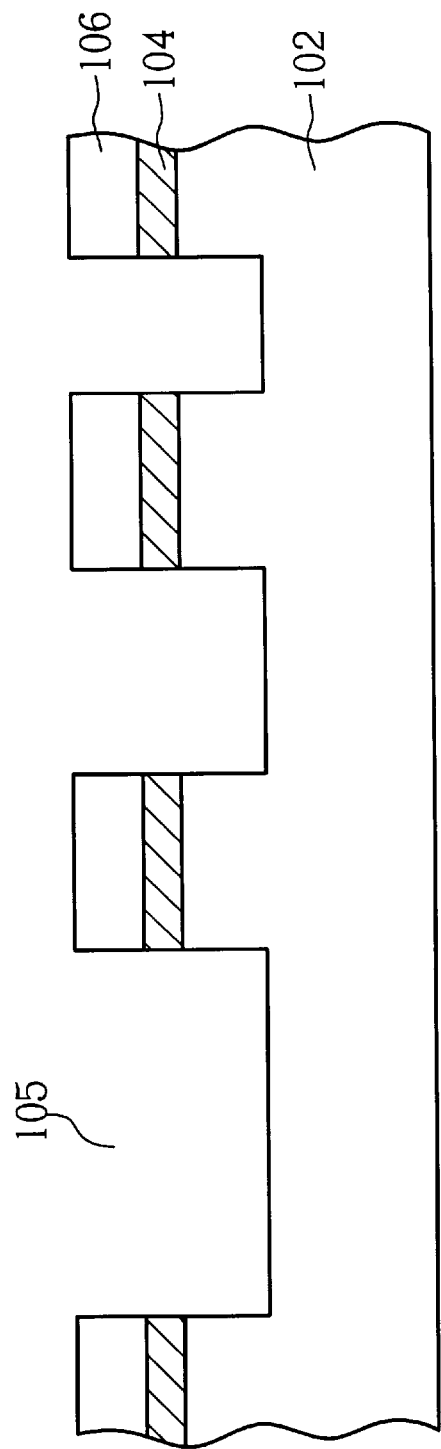
FIG. 1 shows a schematic cross-sectional view of a defined active area by mask and then recess substrate by dry etching according to the present invention.

Shown in FIG. 1, a pad oxide 104 and a silicon nitride 106 is deposited on the silicon substrate 102. The oxide and nitride layers are patterned using photolithography, portions of which are etched away to expose the silicon substrate 102 below. Then the silicon substrate 102 is etched using dry etching methods, such as the Reaction Ion Etch (RIE). The nitride and oxide layers are used as an etching mask. Isolation regions 105 are thereby formed.

Figure 2:
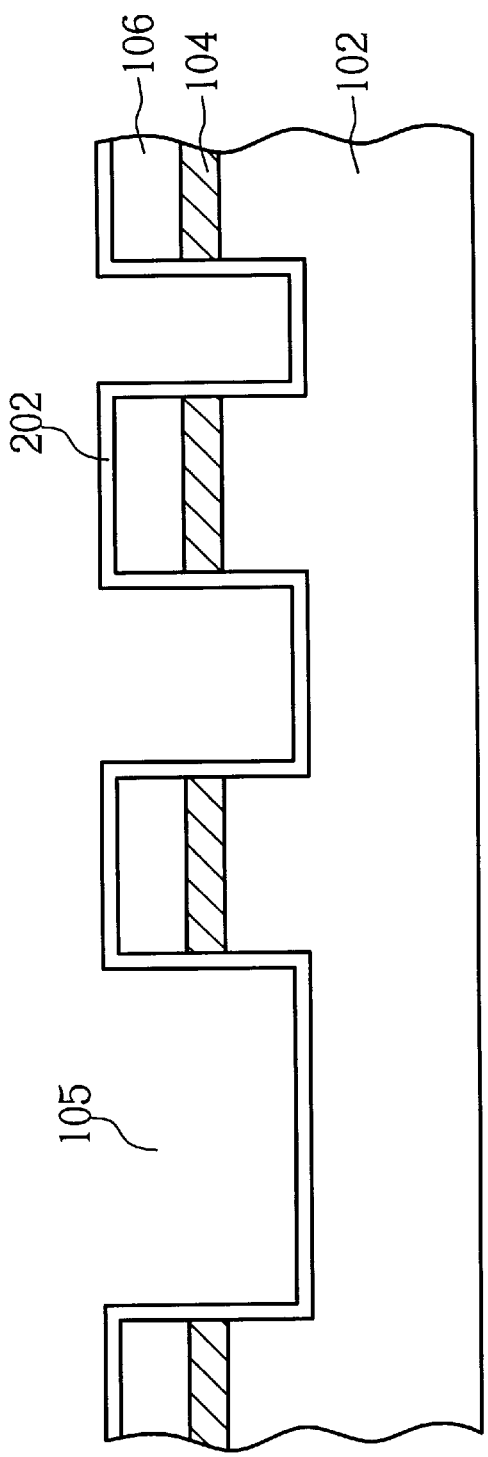
FIG. 2 shows the cross-sectional view of depositing oxidation resistance thin film according to the present invention.

Shown in FIG. 2, an oxidation-resistant thin film 202 is deposited around the silicon nitride film 106 and the isolated area 105. Oxynitride can be used for the oxidation-resistant film 202. With a better oxidation resistance than pure oxide, oxynitrides such as SiO$x$N$y$ are used as the oxidation resistance film 202. The oxidation-resistant film 202 could be deposited by using the traditional Low-Pressure Chemical Vapor Deposition (LPCVD) or Low Pressure Rapid Thermal Chemical Vapor Deposition (LPRTCVD).

As shown in FIG. 3, for preventing the effect of lateral oxidation, oxidation resistance spacers 302 are formed upon the two-side walls of the oxidation-resistant film 202. Polysilicon, for instance, can be used as oxidation-resistant spacers 302. It is firstly to deposit a polysilicon film around the surfaces of the oxidation-resistant film 202, then to etch part of the oxidation-resistant film and the polysilicon film by dry etching method to form the Poly-Si Spacers (the oxidation-resistant spacers 302).

FIG. 4 shows a cross-sectional view of growing an oxide 402 upon the isolated area 105. The invention employs thermal oxidation to oxidize the special region of the substrate 102 to grow oxide, SiO2 402. As above mentioned, because both the oxidation-resistant film 202 and the oxidation resistance spacers 302 are oxidation resistant, bird's beak lateral encroachment is more effectively prevented; that is, abrupt interfaces are formed upon the two-side walls of the isolated area 105. The above thermal oxidation method could be achieved by the dry oxidation method or the wet oxidation method familiar to the industry. And, in the process, the benefits of thermal oxidation method for growing the oxide 402 (SiO2) are not only to provide good quality isolation layers, but also to compensate or eliminate the defects resulting from etching the substrate 102 while forming the isolated area 105.

Figure 5:
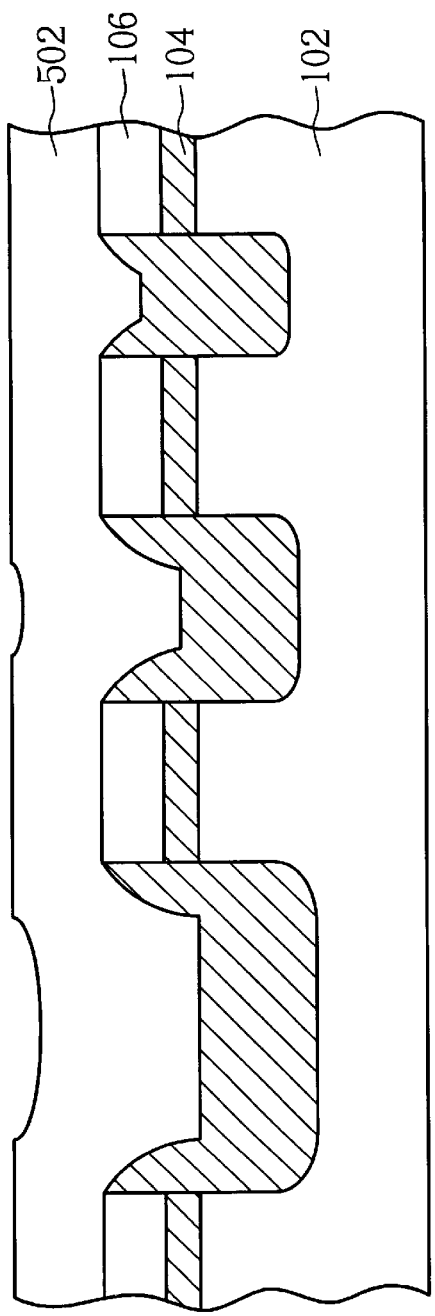
FIG. 5 shows the cross-sectional view of depositing the dielectric material film on the silicon dioxide film according to the present invention.

Shown in FIG. 5, a first dielectric material film 502 is deposit on the oxide 402 (SiO2) by a CVD method. Dielectric material film 502 can be a material such as Boro-Phospho Silicate Glass (BPSG) or Spin-On-Glass (SOG). And it is to thermal reflow the dielectric material to obtain a smooth surface on the dielectric material.

Figure 6:
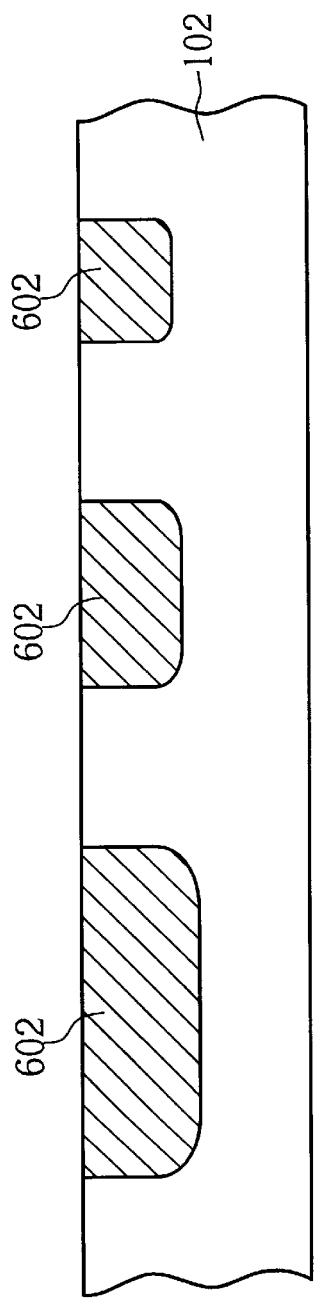
FIG. 6 shows the cross-sectional view of removing the dielectric material film and planarizing the substrate and the isolated trench according to the present invention.

FIG. 6 shows a cross-sectional view of the planarizing of both the substrate and the isolation trench. For this purpose, the invention employs a conventional dry etching method, such as Reaction Ion Etch (RIE) or Chemical Mechanical Polishing (CMP), to etch the dielectric material film 502 and parts of the oxide 402 to obtain a shallow trench isolation with global planarization 602.

According to the above description, the process of the invention is novel and different. For instance, to form the oxidation resistance thin films and spacers on the mentioned isolated area region; bird's beak lateral encroachment is more effectively prevented while growing the oxide film on the isolated area; that is, the present invention is able to form the required abrupt interfaces upon the two-side walls of the isolated area region. In addition, the invention uses a thermal oxidation method to grow the oxide film so that the results are not only to form good quality isolated layers, but also to recover the defects resulting from etching the substrate while forming the isolated area.

While the present invention has been particularly shown and described with reference to the preferred embodiments of producing the shallow trench isolation with global planarization, it will be understood by those skilled in the art that the foregoing and other changes in form and details may be made therein without departing from the spirit and scope of the invention.

What is claimed is:

1. A method for fabricating a shallow isolation trench, comprising the steps of:

(a) depositing a mask over the surface of a semiconductor substrate;

(b) etching said substrate through the voids of said mask to form a recessed region;

(c) depositing an oxidation-resistant thin film deposited thereon;

(d) forming a spacer over the side wall of each said oxidation-resistant thin film deposited thereon;

(e) removing said oxidation-resistant thin film not covered by said spacer;

(f) forming an oxide film over said recessed region within said substrate;

(g) depositing a dielectric film over said mask filling said oxide-filmed recessed region;

(h) removing said dielectric film, said mask, and said oxide film between said dielectric film thereby planarizing the surface of said substrate having said recessed region.

2. A method for fabricating a shallow isolation trench, comprising the steps of:

(a) depositing a mask over the surface of a semiconductor substrate;

(b) etching said substrate to form a recessed region using said mask;

(c) depositing an oxidation-resistant thin film over the surfaces of said mask and said recessed region;

(d) forming a spacer over the side wall of each said recessed region having said oxidation-resistant thin film deposited thereon;

(e) etching the portion of said oxidation-resistant thin film not covered by said spacer;

(f) converting said spacer into an oxide spacer by thermal oxidation;

(g) depositing a dielectric film over said mask and said recessed region filled with oxide spacer;

(h) heating said dielectric film to thermally reflow said dielectric film to obtain a smooth surface on said dielectric film;

(i) removing said dielectric film, said mask, and said oxide spacer between said dielectric film and thereby globally planarizing the surface of said substrate having said recessed region.

3. The method as recited in claim 1 or claim 2, wherein a pad oxide is grown between said semiconductor substrate and said mask.

4. The method as recited in claim 1 or claim 2, wherein said mask is made of silicon nitride.

5. The method as recited in claim 1, wherein said oxidation-resistant thin film is made of oxynitride.

6. The method as recited in claim 1 or claim 2, wherein said spacer is made of polysilicon.

7. The method as recited in claim 1, wherein said oxide film is made of silicon dioxide.

8. The method as recited in claim 2, wherein said oxide spacer is made of silicon dioxide.

9. The method as recited in claim 1 or claim 2, wherein said dielectric film is made of Boro-Phospho Silicate Glass, BPGS.

10. The method as recited in claim 1, wherein the step (h) is achieved by the method of Chemical Mechanical Polishing (CMP).

11. The method as recited in claim 2, wherein the step (i) is achieved by the method of Chemical Mechanical Polishing (CMP).

* * * * *